United States Patent
Takano et al.

Patent Number: 5,667,584
Date of Patent: Sep. 16, 1997

[54] METHOD FOR THE PREPARATION OF A SINGLE CRYSTAL OF SILICON WITH DECREASED CRYSTAL DEFECTS

[75] Inventors: Kiyotaka Takano; Eiichi Iino, both of Gunma-ken; Masahiro Sakurada, Fukushima-ken; Hirotoshi Yamagishi, Gunma-ken, all of Japan

[73] Assignee: Shin-Etsu Handotai Co., Ltd., Tokyo, Japan

[21] Appl. No.: 565,100

[22] Filed: Nov. 30, 1995

[30] Foreign Application Priority Data

Dec. 5, 1994 [JP] Japan ................................. 6-300479

[51] Int. Cl.⁶ ................................................. C30B 15/20
[52] U.S. Cl. .......................... 117/13; 117/14; 117/208
[58] Field of Search ............................. 117/1, 13, 200, 117/208, 217, 218, 222, 15

[56] References Cited

U.S. PATENT DOCUMENTS

| | | |
|---|---|---|
| 4,956,153 | 9/1990 | Yamagishi et al. ........... 117/217 |
| 5,152,867 | 10/1992 | Kitaura et al. ................ 117/20 |

FOREIGN PATENT DOCUMENTS

| | | | |
|---|---|---|---|
| 0504837A3 | 9/1992 | European Pat. Off. | |
| 2-229791 | 9/1990 | Japan | 117/217 |
| 3065593 | 3/1991 | Japan | 117/217 |
| 5-279172 | 10/1993 | Japan | 117/217 |
| 5-294783 | 11/1993 | Japan | 117/217 |

OTHER PUBLICATIONS

*Patent Abstracts of Japan*, vol. 13, No. 224 (C-599) (abstract of JP-A-01 037490) (May 1989).

*Patent Abstracts of Japan*, vol. 18, No. 575 (C-1268) (abstract of JP-A-62 011591) (Nov. 1994).

*Primary Examiner*—Felisa Garrett
*Attorney, Agent, or Firm*—Wenderoth, Lind & Ponack

[57] ABSTRACT

An improvement is proposed in the single crystal growing process of semiconductor silicon in the Czochralski process to obtain a silicon single crystal having a greatly decreased number of crystal defects without affecting the productivity. The improvement can be accomplished by an adequate arrangement of the cooling zone of the single crystal growing puller to have such a temperature distribution that the time taken by the growing single crystal to pass through the temperature range from the melting point of silicon to 1200° C. is from 50 minutes to 200 minutes and the time taken by the growing single crystal to pass through the temperature range from 1200° C. to 1000° C. does not exceed 130 minutes.

1 Claim, 3 Drawing Sheets

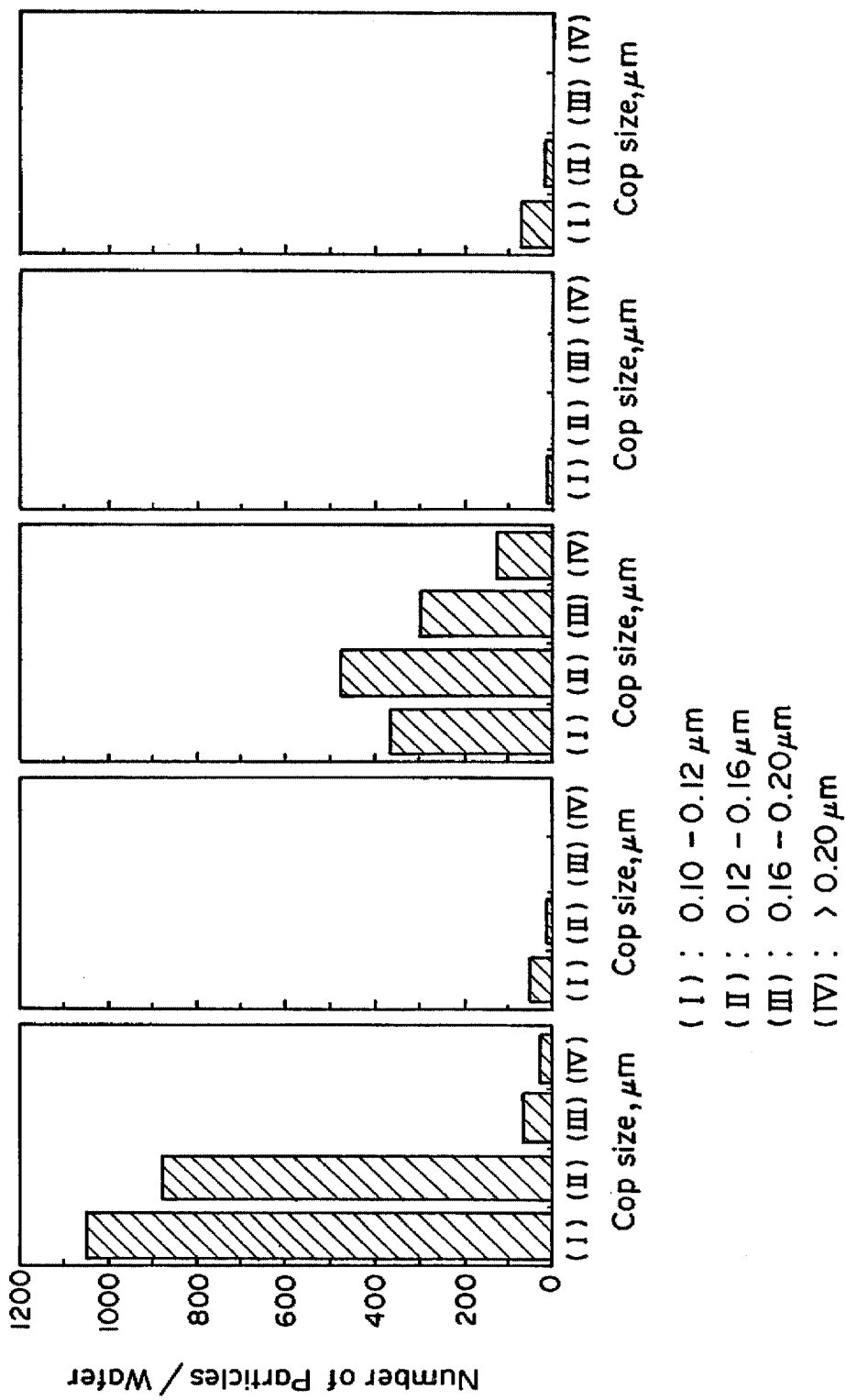

METHOD FOR THE PREPARATION OF A SINGLE CRYSTAL OF SILICON WITH DECREASED CRYSTAL DEFECTS

BACKGROUND OF THE INVENTION

The present invention relates to a method for the preparation of a single crystal of silicon with decreased crystal defects or, more particularly, to a highly efficient method for the preparation of a single crystal rod of semiconductor silicon by the Czochralski process in which the number of crystal defects is remarkably decreased.

One of the very serious problems in the manufacture of semiconductor devices in a process including patterning on a single crystal wafer of semiconductor silicon is adsorption or adhesion of various particulate materials on the wafer because breakage of device pattern is sometimes caused thereby. This problem is particularly serious when the fineness of patterning is so high as to have a line width of 0.3 µm or even smaller in the patterning for the preparation of a device utilizing the leading technology such as 64M DRAMs because a particle having a particle diameter of 0.1 µm or even finer may cause a breakage of device patterning to greatly decrease the yield of acceptable products. Accordingly, prevention of particle deposition on the silicon wafer is an important problem to be solved.

In view of the above mentioned problem of particle deposition on the silicon wafer, the manufacturing process of silicon wafers is under a very strict control by using a particle counter with an object to uncover the sources of particle generation, to check the effectiveness of cleaning, to monitor the cleanness of the clean room, to inspect the final products of silicon wafers before shipping, and so on.

In the counting procedure of particles by the use of a conventional particle counter, the surface of a silicon wafer is irradiated spotwise with a laser beam having a diameter of 10 to 100 µm under scanning and the very faint light scattered by the particles on the wafer surface is efficiently collected by means of a large number of optical fibers or an integrating sphere to convert the light into electric signals by means of a photoelectric device. In other words, a conventional particle counter works on a principle to count the number of the light points on the wafer surface caused by light scattering at the particles.

As is known, very small crystal defects are formed in a single crystal rod of silicon during the growth and the defects remain as such in the silicon wafers prepared from the single crystal rod through the wafer shaping process without annihilation during the procedure of cooling down of the single crystal as grown. When such a silicon wafer is subjected to a cleaning treatment in a cleaning solution which is a mixture of ammonia water and an aqueous hydrogen peroxide solution with an object to remove particles deposited thereon as is conventionally undertaken, a large number of pits are formed on the surface of the silicon wafer because the rate of etching is high in the crystal defects indicating generation of crystal defects. When a silicon wafer after such a cleaning treatment is subjected to counting of the particles adsorbed thereon by using a particle counter mentioned above, the true number of the particles can never be obtained because scattering of light, which is detected and counted as a particle by the particle counter, occurs also at the pits formed by the etching treatment.

It is a known trend that the number of crystal defects is much larger on a silicon wafer prepared by working from a single crystal silicon rod grown by the Czochralski (CZ) method than on a single crystal silicon wafer prepared by working from a single crystal rod obtained by the floating zone-melting (FZ) method or on a so-called epitaxial silicon wafer which is a single crystal wafer of silicon by the CZ method and provided with an epitaxially grown thin film of silicon on the surface.

It is also known in the prior art that the number of crystal defects introduced into a single crystal silicon rod during the single crystal growth can be greatly decreased if growing of the silicon single crystal by the CZ method is undertaken at a greatly decreased rate of, for example, 0.4 mm/minute or lower as is disclosed in Japanese Patent Kokai 2-267195. While the rate of single crystal growing of silicon is usually at least 1 mm/minute in the conventional process, this approach of greatly decreasing the crystal growing rate to 0.4 mm/minute or lower is not practicable because the desired decrease in the number of crystal defects can be accomplished only at a great sacrifice of the productivity to less than a half consequently with a great increase in the production costs even though the number of crystal defects could be decreased so far.

SUMMARY OF THE INVENTION

The present invention accordingly has an object, in view of the above described problems and disadvantages in the prior art, to provide a novel and highly productive method for the preparation of a single crystal silicon rod having a greatly decreased number of crystal defects by the CZ process without substantially decreasing the productivity of the single crystal growing process.

Thus, the present invention provides an improvement, in the Czochralski process for the preparation of a single crystal rod of silicon by pulling up the single crystal rod under growing from a melt of silicon on the lower end of a seed crystal of silicon in which the growing single crystal rod of silicon is subjected to a thermal history of a successively decreasing temperature starting from the melting point of silicon, which improvement comprises controlling the process of pulling-up of the growing single crystal rod from the melt of silicon through a cooling zone above the melt with an upwardly decreasing temperature distribution in such a way that the length of time taken by a section of the single crystal leaving the surface of the silicon melt to pass through a cooling zone in the temperature range from 1200° C. to 1000° C. does not exceed 130 minutes.

In another aspect of the present invention, the improvement can be further enhanced by controlling the process in such a way that the length of time taken by a section of the single crystal leaving the surface of the silicon melt to pass through a first cooling zone in the temperature range from the melting point of silicon to 1200° C. is shorter than 200 minutes and the length of time taken By the section of the single crystal to pass through a second cooling zone in the range from 1200° C. to 1000° C. does not exceed 130 minutes.

BRIEF DESCRIPTION OF THE DRAWING

FIGS. 3a, 3b, 3c, 3d and 3e are each a histogram showing the number of COPs (see the definition given below) of different sizes in the silicon single crystals grown under the conditions of temperature decrease shown by the respective cooling curves in FIG. 2.

DETAILED DESCRIPTION OF THE PREFERRED EMBODIMENTS

Figure 1A:
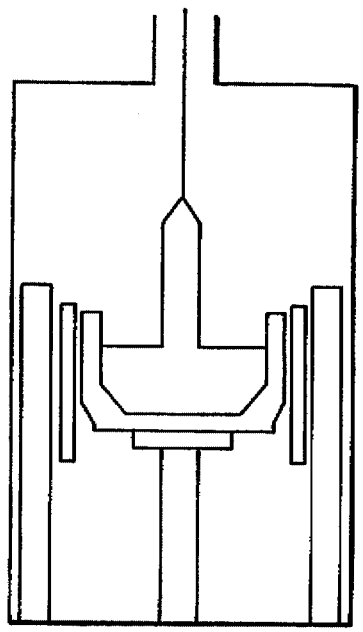
FIGS. 1a, 1b, 1c and 1d are each a schematic vertical cross sectional view of the silicon single crystal puller by the Czochralski process with a different arrangement of the heat-insulating shield structure.

The detailed description of the preferred embodiments is preceded by the explanation of the definitions of two key terms used hereinafter.

1) SC-1 cleaning:

This term means a cleaning treatment to remove particles and organic compounds from the single crystal wafer of silicon by cleaning with a cleaning solution which is a mixture of ammonia water and an aqueous solution of hydrogen peroxide in a weight ratio $NH_4OH:H_2O_2:H_2O$ of 1:1:5. This cleaning solution is known to be particularly effective for the removal of particles.

2) COP (crystal-originated particle):

When a silicon single crystal wafer after polishing is subjected to the SC-1 cleaning, a number of pits are formed on the surface of the wafer. The number of particles detected by using a particle counter usually includes, in addition to the number of true particles on the surface, the number of these pits. The term COP means such a pit which is unavoidably detected and counted by a particle counter to give an error over the number of true particles. It is known that degradation of the oxide dielectric breakdown voltage characteristic of a silicon wafer is caused as the number of COPs is increased.

Due to the phenomenon of generation of COPs, the silicon wafers prepared from a single crystal rod grown by the conventional CZ process cannot be used as a reference wafer for the number of true particles for particle monitoring in the fabricating process of semiconductor devices.

The inventors conducted extensive experiments in which the pulling speed of single crystal growing of silicon in the CZ process was suddenly changed from a high speed to a low speed with an object to know the mechanism for the decrease in the number of COPs in a silicon single crystal rod grown at a low crystal growing rate and arrived at an unexpected discovery of the fact that the decrease in the number of COPs was found not in the critical section of the single crystal rod which had left the surface of the silicon melt just at the moment of the change of growth rate but in the section within the already formed portion of the crystal at a position by about 8 cm higher than the above mentioned critical section. This fact strongly suggests that the annihilation process of the crystal defects is under the influence of the thermal history which the already grown portion of the single crystal receives in the cooling process by passing through the cooling zone from the melting point of silicon to about 1200° C., hereinafter referred to as the first temperature range, and not of the process of crystallization-out at the melt-crystal interface.

The next step of the experiments undertaken by the inventors was to conduct the single crystal growing tests in several single crystal growing puller giving different profiles of temperature distribution above the melt surface, as are illustrated in FIGS. 1a to 1d by a schematic vertical cross sectional view, to give different thermal histories to the single crystal under growing relative to the time taken for passing through the first temperature range, referred to as the first cooling time hereinafter, and to study the correlation between the first cooling time and the number of COPs in the single crystal of silicon thus grown. The result was that the number of COPs was greatly increased when the first cooling time was decreased below 200 minutes.

Accordingly, a conclusion obtained by these experiments was that the first cooling time should be at least 200 minutes in order to obtain a single crystal rod of silicon having a greatly decreased number of COPs by the CZ process.

Needless to say, the first cooling time in a single crystal growing process can be 200 minutes or longer if the pulling rate of the single crystal growth is very low, for example, to be 0.4 mm per minute or lower although such a means is not practicable due to the extreme decrease in the productivity of the process. Advantageously, such a desirable thermal history of the single crystal during growth can be accomplished without decreasing the productivity of the process when the dimension of the high temperature area within the single crystal puller is upwardly extended as is illustrated by the cross sectional view in FIG. 1b by the use of elongated heat-insulating shields as compared with the conventional heat-insulating shields illustrated in FIG. 1a.

Figure 1B:
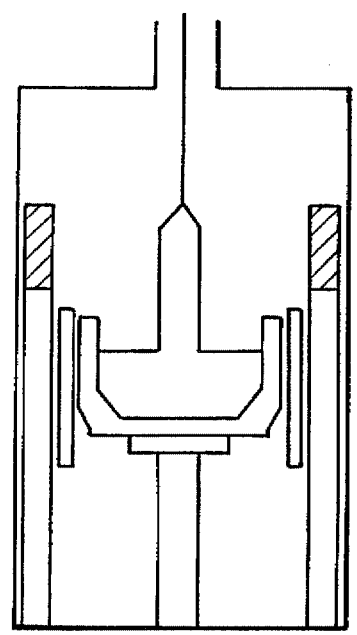
Figure 2:
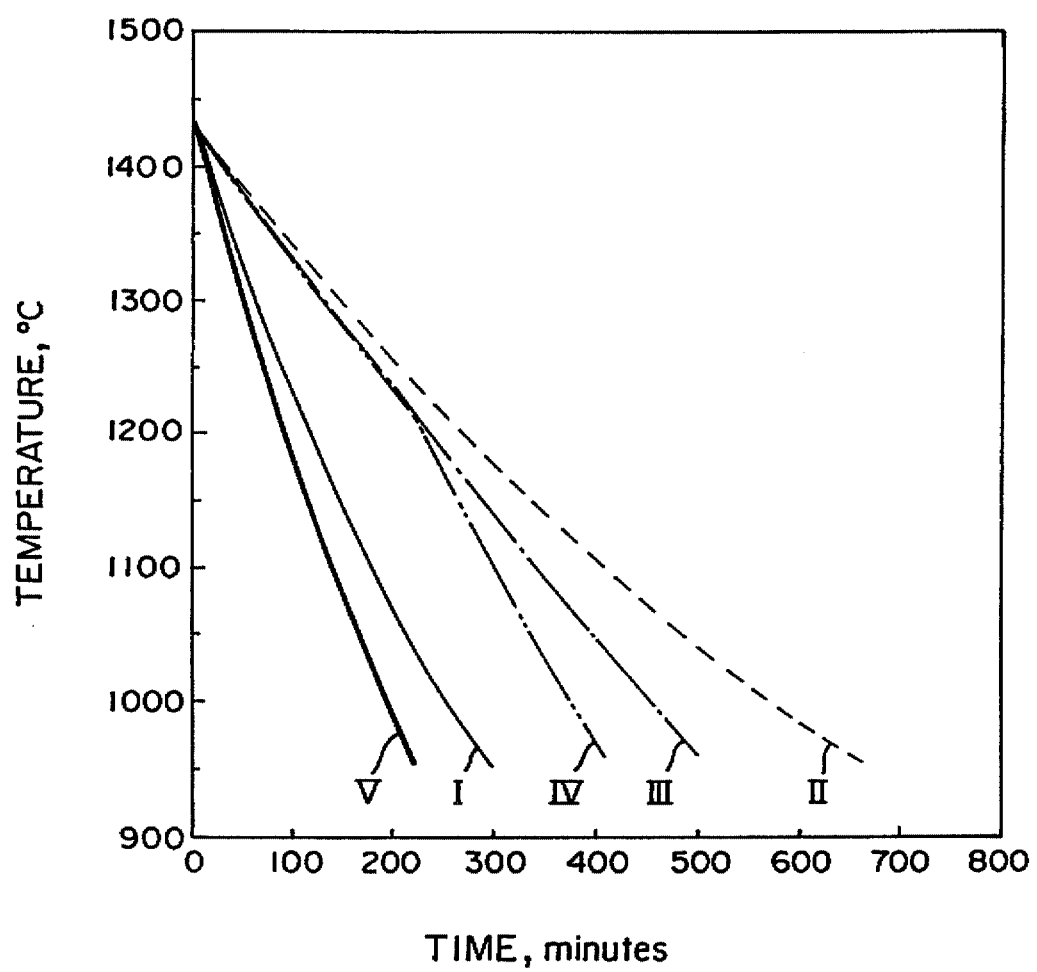
FIG. 2 is a graph showing cooling curves in a single crystal of silicon under growing in each of the single crystal pullers illustrated in FIGS. 1a, 1b, 1c and 1d giving different profiles of thermal history to the growing single crystal.

In fact, the silicon single crystal rod grown in the single crystal puller illustrated in FIG. 1b, referred to as the case III hereinafter, in which the first cooling time was 200 minutes or longer, had a number of COPs having a dimension of 0.16 μm or smaller as is shown by the histogram in FIG. 3c decreased to about a half of that in the single crystal grown in the conventional puller illustrated in FIG. 1a at a conventional pulling rate, referred to as the case I hereinafter, to give the COPs shown by the histogram in FIG. 3a although the decrease in the number of small COPs could not be so great as in the single crystals grown at a low growing rate, referred to as the case II hereinafter, shown in FIG. 3b rather with an increase in the number of the COPs having a size of 0.16 μm or larger (FIG. 3c). FIG. 2 shows the cooling curve of a section of the growing single crystal as a function of the time elapsed from the moment when the section had left the surface of the silicon melt at the melting point of silicon in the above mentioned cases I, II and III by the curves I, II and III, respectively. As is understood from these cooling curves, the first cooling time in the case III was, as was intended, longer than 200 minutes but the result relative to the generation of COPs was not satisfactory as is shown by the histogram in FIG. 3c. These results suggest that the number of COPs cannot be decreased to the same level as in the case II by merely taking a means of controlling the cooling process in the first temperature range from the melting point of silicon to 1200° C.

The next approach undertaken was to study the thermal history in the temperature region lower than 1200° C. on the cooling curves shown in FIG. 2. Namely, the length of time taken by the single crystal under cooling to pass through the temperature range from 1200° C. to 1000° C., i.e. the second cooling time, was estimated from the respective cooling curves to find that the second cooling time in the case III is longer than that in the case I but the second cooling time in the case II, in which a silicon single crystal having an extremely small number of COPs was obtained, was still longer than in the case II.

A mechanism for the extremely small number of COPs in the single crystal obtained in the case II presumable from the above described facts is that annihilation of the point defects per se, which may be the nuclei of COPs generated in the single crystal, took place during the long period within the temperature range of 1200° C. or higher and further a reaction thereof with oxygen took place during the period in which the single crystal was kept in the second temperature range of 1200° C. to 1000° C. resulting in growing and agglomeration to decrease the density of COPs. In fact, very large pits having a diameter of about 20 μm were found in the single crystal wafer obtained in the case II but the density thereof was extremely low not to exceed 100 pits per $cm^2$.

According to the reports appearing in Japanese Journal of Applied Physics, volume 32 (1993), pages 1740 to 1758 and Journal of Electrochemical Society, volume 140, No. 11 (November, 1993), pages 3306 to 3316, it is presumable that the COPs as a type of crystal defects are in the state of point defects at the high temperature range of 1200° C. or higher and then converted into huge defects by the growth of defects having relevancy to impurities such as oxygen and the like in the lower temperature range of 1200° C. to 1000° C. after the process of annihilation by the pair annihilation reaction caused corresponding to the so-called slope diffusion or degree of supersaturation between the point defects.

Namely, the fact that the density of COPs is extremely low in the silicon single crystal obtained in the case II with a very low cooling rate is merely due to the small number of pits having a size of 0.2 μm or smaller, which can be detected and counted as COPs by the particle counter, while such small pits have agglomerated to grow into a smaller number of larger pits.

In this regard, the inventors have discovered that a silicon single crystal having a decreased number of COPs or, in particular, huge pits can be grown without occurrence of defect growth due to participation of oxygen and the like when the first cooling time through the temperature range from the melting point of silicon to 1200° C. is set to be 200 minutes or longer as in the case II as well as in the case III so as to effect annihilation of the point defects which act as the nuclei of COPs and then the second cooling time through the temperature range from 1200° C. to 1000° C. is set not to exceed 150 minutes so as to effect relatively rapid cooling as in the case I although the overall rate of single crystal growth is lower by about 10% than in the case I. Such a cooling schedule of the growing single crystal is referred to as the case IV and shown by the curve IV in FIG. 2.

The above described discovery has led to a conclusion that growth of defects can be suppressed by increasing the rate to pass through the second temperature range of 1200° C. to 1000° C. In due course, accordingly, it has been discovered that, when the second cooling time to pass through the second temperature range of 1200° C. to 1000° C. is further decreased not to exceed 130 minutes consequently to decrease the annihilation effect of the point defects due to the shortage in the first cooling time to pass through the first temperature range of down to 1200° C., for example, to be shorter than 200 minutes, the otherwise unavoidable subsequent process of growth or agglomeration of the defects can be almost completely prevented leading to completion of the present invention.

Figure 1C:
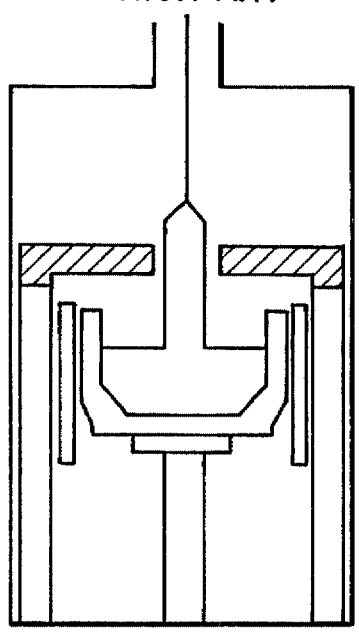
Figure 1D:
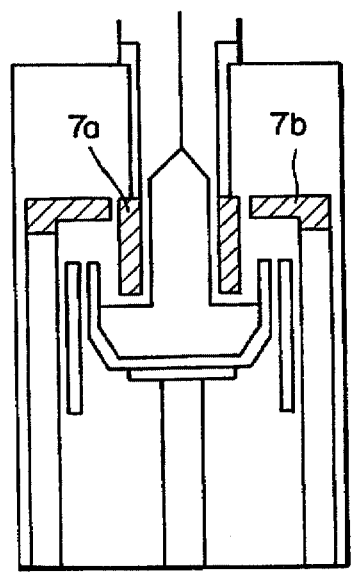

The cooling process of the silicon single crystal under growing according to the present invention by using the single crystal puller provided with the heat-insulation tube 7a and heat-insulation shield 7b as is illustrated in FIG. 1d, referred to as the case V hereinafter, is shown, for example, by the curve V in FIG. 2. In this case, the overall crystal growing rate is about the same as or 10 to 20% larger than in the conventional method. Accordingly, the inventive method is advantageous not only in respect of the great decrease in the number of COPs but also in respect of the improvement in the productivity of the crystal growing process.

When a single crystal rod of silicon is grown by the CZ process, a section of the single crystal rod gradually passes through the cooling zone from about 1412° C., i.e. the melting point of silicon, to room temperature. The thermal history in the respective case is controllable by adequately modifying the forms and arrangement of the heat-insulating shields usually formed from a carbonaceous material installed within the single crystal pulling chamber so as to have an appropriate temperature gradient within the puller chamber. FIG. 1d illustrates an example of an arrangement of the crystal growing puller suitable for practicing the improvement according to the present invention by a schematic vertical cross sectional view. Needless to say, the arrangement illustrated in FIG. 1d is only an example of suitable arrangements leaving possibilities of various modifications provided that the cooling curve obtained therein follows the curve V in FIG. 2 in which the first cooling time through the first temperature range from the melting point of silicon to 1200° C. is 200 minutes or shorter and the second cooling time through the second temperature range from 1200° C. to 1000° C. is 130 minutes or shorter.

According to the present invention, the first cooling time through the first temperature range from the melting point of silicon to 1200° C. is 200 minutes or shorter so that the annihilation effect of point defects can not always be high enough while the second cooling time through the second temperature range from 1200° C. to 1000° C. is 130 minutes or shorter so that the subsequent growth or agglomeration process of the defects can be almost completely prevented.

Examples 1 and Comparative Examples 1 to 4.

A fused silica glass crucible of 18-inches diameter was charged with 50 kg of polycrystalline silicon blocks as the starting material of the CZ process for single crystal growing. Five silicon single crystals of 6-inches diameter having a crystallographic orientation of <100> were grown in Example 1 and Comparative Examples 1 to 4 under respectively different growing conditions in single crystal pullers having respectively heat-insulating shields of different structures as shown in FIGS. 1a to 1d.

In Example 1, the furnace had a heat-insulating structure illustrated in FIG. 1d by a vertical cross sectional view and the cooling curve was that shown by the curve V of FIG. 2 in which the first and second cooling times were 90 minutes and 105 minutes, respectively.

In Comparative Example 1, the puller had a heat-insulating shield illustrated in FIG. 1a by a vertical cross sectional view and the cooling curve was that shown by the curve I of FIG. 2 according to a conventional rapid-cooling procedure, in which the first and second cooling times were 110 minutes and 150 minutes, respectively.

In Comparative Example 2, the furnace had a heat-insulating structure illustrated in FIG. 1a by a vertical cross sectional view but the cooling curve was that shown by the curve II of FIG. 2 in which the pulling-up rate of the single crystal was decreased to 0.4 mm/minute so that the first and second cooling times were 268 minutes and 315 minutes, respectively.

In Comparative Example 8, the puller had a heat-insulating structure illustrated in FIG. 1b by a vertical cross sectional view and the cooling curve was that shown by the curve III of FIG. 2 in which the cooling rate from the melting point of silicon to 1000° C. was low so that the first and second cooling times were each 225 minutes.

In Comparative Example 4, the furnace had a heat-insulating shield of the structure illustrated in FIG. 1c by a vertical cross sectional view and the cooling curve was that shown by the curve IV of FIG. 2 in which slow cooling from the melting point of silicon to 1200° C. was followed by rapid cooling from 1200° C. to 1000° C. so that the first and second cooling times were 225 minutes and 145 minutes, respectively.

Each of the silicon single crystals thus grown was sliced into wafers which were subjected to mirror polishing and then to a cleaning treatment with an SC-1 cleaning solution described before at a temperature of 77° C. Thereafter, the thus cleaned wafers were subjected to counting of particles by using a particle counter Model LS-6030. With an object to make differentiation from exogenous particles, the SC-1 cleaning treatment and particle counting were repeated five times.

The histograms of FIGS. 3a, 3b, 3c, 3d and 3e show the distribution of the numbers of COPs per wafer for the respective sizes as a result obtained by the determination of the number of COPs in Comparative Examples 1, 2, 3 and 4 and Example 1, respectively.

The histogram of FIG. 3a shows the results obtained in Comparative Example 1 in which the cooling rate through the first temperature range down to 1200° C. was high to give a high density of the nuclei of defects and the cooling rate through the second temperature range was also high so as to give a large number of COPs having a small size of 0.10 to 0.16 µm as a consequence of absence of the growing process of the defect nuclei.

The histogram of FIG. 3b shows the results obtained in Comparative Example 2 in which the cooling rate through the first temperature range down to 1200° C. was low to give a low density of the defect nuclei and the cooling rate through the second temperature range from 1200° C. to 1000° C. was extremely low to cause agglomeration and growth of the defect nuclei to such an extent that they could no longer be counted as COPs.

The histogram of FIG. 3c shows the results obtained in Comparative Example 3 in which the cooling rates through the first and second temperature ranges were relatively low but not so low as in Comparative Example 2 so that the density of the defect nuclei formed in the first temperature range was low as compared with Comparative Example 1 while the low cooling rate through the second temperature range caused growth of the nuclei resulting in the shift of the histogram toward larger sizes of the COPs as compared with FIG. 3a.

The histogram of FIG. 3d shows the results obtained in Comparative Example 4 in which the cooling rate through the first temperature range was low to effect the annihilation process of the point defects while the cooling rate through the second temperature range of 1200° to 1000° C. was high not to cause growing of the defects enabling a still greater decrease in the number of COPs than in Comparative Example 2 although the crystal growing rate was by about 10% lower than in Comparative Example 1.

The histogram of FIG. 3e shows the results obtained in Example 1 in which the cooling rate through the first temperature range was high so that the annihilation process of point defects was insufficient to cause some increase in the number of COPs but the improvement as compared with FIG. 3a by the conventional process was remarkable and the crystal growing rate was increased by 10 to 20% as compared with Comparative Example 1.

What is claimed is:

1. In a process for the single crystal growth of semiconductor silicon in a Czochralski process by pulling up a single crystal rod of silicon from a melt of silicon in which the growing single crystal rod of silicon leaving the melt of silicon passes through a cooling zone of an upwardly decreasing temperature distribution to be at successively decreasing temperature, the improvement which comprises adjusting the upwardly decreasing temperature distribution in the cooling zone above the melt of silicon and the pulling rate of the growing single crystal rod in such a way that the length of time during which the growing single crystal of silicon is at a temperature in the range from the melting point of silicon to 1200° C. is shorter than 200 minutes and the length of time during which the growing single crystal of silicon is at a temperature in the range from 1200° C. to 1000° C. does not exceed 130 minutes.

* * * * *